US012787858B2

(12) United States Patent
Loh et al.

(10) Patent No.: US 12,787,858 B2
(45) Date of Patent: Nov. 3, 2026

(54) SEMICONDUCTOR DEVICE WITH AN EMBEDDED ACTIVE DEVICE

(71) Applicant: Advanced Micro Devices, Inc., Santa Clara, CA (US)

(72) Inventors: Gabriel H. Loh, Bellevue, WA (US); Rahul Agarwal, Santa Clara, CA (US); Raja Swaminathan, Austin, TX (US); Brett P. Wilkerson, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/560,691

(22) Filed: Dec. 23, 2021

(65) Prior Publication Data

US 2023/0207544 A1 Jun. 29, 2023

(51) Int. Cl.
*H01L 25/18* (2023.01)
*H01L 21/768* (2006.01)
(Continued)

(52) U.S. Cl.
CPC ........ *H01L 25/18* (2013.01); *H01L 21/76898* (2013.01); *H01L 24/16* (2013.01);
(Continued)

(58) Field of Classification Search
CPC ................ H01L 25/0657; H01L 25/18; H01L 21/76898; H01L 24/16; H01L 25/50;
(Continued)

(56) References Cited

U.S. PATENT DOCUMENTS

2010/0219516 A1 9/2010 Narendra et al.
2011/0161682 A1 6/2011 Wen et al.
(Continued)

OTHER PUBLICATIONS

A. Chaudhuri, S. Kannan, L. England and J. Golz, "Compact Scalable Dynamic TSV IR Drop Compensation for Power Delivery in 3D Packages," 2019 IEEE 62nd International Midwest Symposium on Circuits and Systems (MWSCAS), Dallas, TX, USA, 2019, pp. 1179-1182, doi: 10.1109/MWSCAS.2019.8885072. (Year: 2019).*
(Continued)

*Primary Examiner* — Ratisha Mehta
(74) *Attorney, Agent, or Firm* — Hickman Becker Bingham Ledesma LLP

(57) ABSTRACT

A semiconductor device includes one or more active devices disposed between a processor die and a package substrate. The semiconductor device includes a first layer with a processor die, a second layer with one or more active devices, and a third layer with a package substrate, where the second layer is disposed between the first and third layers. The one or more active devices are semiconductor-based devices, such as voltage regulators, that participate in supplying power to the processor die and are electrically connected to the processor die using various connection configurations. The implementations use short path lengths for improved performance with a compact structure that avoids the use of edge wiring or interposers without occupying processor die space. Implementations include the use of through-silicon vias (TSVs) to provide short path lengths while reducing the number of connection resources used by the one or more power components.

15 Claims, 3 Drawing Sheets

(51) Int. Cl.
*H01L 23/00* (2006.01)
*H01L 25/00* (2006.01)

(52) U.S. Cl.
CPC .... *H01L 25/50* (2013.01); *H01L 2224/16145* (2013.01); *H01L 2224/16225* (2013.01)

(58) Field of Classification Search
CPC . H01L 2224/16145; H01L 2224/16225; H01L 23/3128; H01L 23/481; H01L 23/562; H01L 2225/06524; H01L 2225/06541; H01L 25/0652
See application file for complete search history.

(56) References Cited

U.S. PATENT DOCUMENTS

2016/0093588 A1 3/2016 Wang et al.
2020/0066677 A1* 2/2020 Bhagavat ............ H01L 25/0652
2020/0105653 A1* 4/2020 Elsherbini ............. H01L 23/645
2022/0093565 A1* 3/2022 Radhakrishnan ....... H01L 28/10
2023/0073026 A1* 3/2023 Elsherbini ............... H01L 24/80
2023/0187386 A1* 6/2023 Pietambaram ...... H01L 23/5385 257/531
2023/0197661 A1* 6/2023 Darmawikarta ........ H01L 25/18 257/770

OTHER PUBLICATIONS

Edward A. Burton et al., "FIVR—Fully Integrated Voltage Regulators on 4th Generation Intel Core SoCs", 2014 IEEE Applied Power Electronics Conference and Exposition—APEC 2014, 2014, pp. 432-439.

The International Bureau of WIPO, "International Preliminary Report on Patentability" in International Application No. PCT 2022/051512 filed Dec. 1, 2022, 5 pages.

* cited by examiner

"Face Up" with TSVs

"Face Down" with TSVs

SEMICONDUCTOR DEVICE WITH AN EMBEDDED ACTIVE DEVICE

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Further, it should not be assumed that any of the approaches described in this section are well-understood, routine, or conventional merely by virtue of their inclusion in this section.

As the computing power of semiconductor devices increases, power delivery becomes more challenging. It is not uncommon for high-end server and other datacenter components to require several hundred Watts of power, making the placement of power components, such as voltage regulators, more critical.

One solution is to incorporate power components into semiconductor device packages closer to where power is needed, but with this approach power must still be delivered across the package substrate to the power consuming dies, which adds impedance to the power distribution network. This approach also consumes valuable routing resources within the package.

Another solution is to collocate power components on the silicon die with semiconductor devices, but this can be expensive for System-on-a-Chip (SoC) applications that are implemented with advanced process node silicon that is more costly. Also, the power components compete with other elements for die area, leading to undesirable tradeoffs in area, power, performance and/or cost.

In view of the foregoing, there is a need for an approach for implementing power components closer to semiconductor devices that avoids the limitations and costs of other solutions.

BRIEF DESCRIPTION OF THE DRAWINGS

Implementations are depicted by way of example, and not by way of limitation, in the figures of the accompanying drawings and in which like reference numerals refer to similar elements.

DETAILED DESCRIPTION

In the following description, for the purposes of explanation, numerous specific details are set forth in order to provide a thorough understanding of the implementations. It will be apparent, however, to one skilled in the art that the implementations may be practiced without these specific details. In other instances, well-known structures and devices are shown in block diagram form in order to avoid unnecessarily obscuring the implementations.

I. Overview
II. Architecture
A. Overview
B. "Face Up" Orientation
C. "Face Down" Orientation
D. Through-Silicon Vias (TSVs)

I. Overview

A semiconductor device includes one or more active devices disposed between a processor die and a package substrate. According to an implementation, the semiconductor device includes a first layer with a processor die, a second layer with one or more active devices, and a third layer with a package substrate, where the second layer is disposed between the first and third layers. The one or more active devices are semiconductor-based devices that perform one or more functions. According to an implementation, the one or more active devices include power components, such as one or more voltage regulators, power management circuits, charge pumps, power rectifiers, power diodes, thyristors, switched-mode power supplies, etc., that participate in supplying power to the processor die and are electrically connected to the processor die using various connection configurations.

The implementations described herein provide the technical benefits of short path lengths for improved performance with a compact structure that avoids the use of edge wiring or interposers without occupying processor die space. Implementations include the use of through-silicon vias (TSVs) to provide short path lengths while reducing the number of connection resources used by the one or more power components.

II. Architecture

A. Overview

Figure 1A:
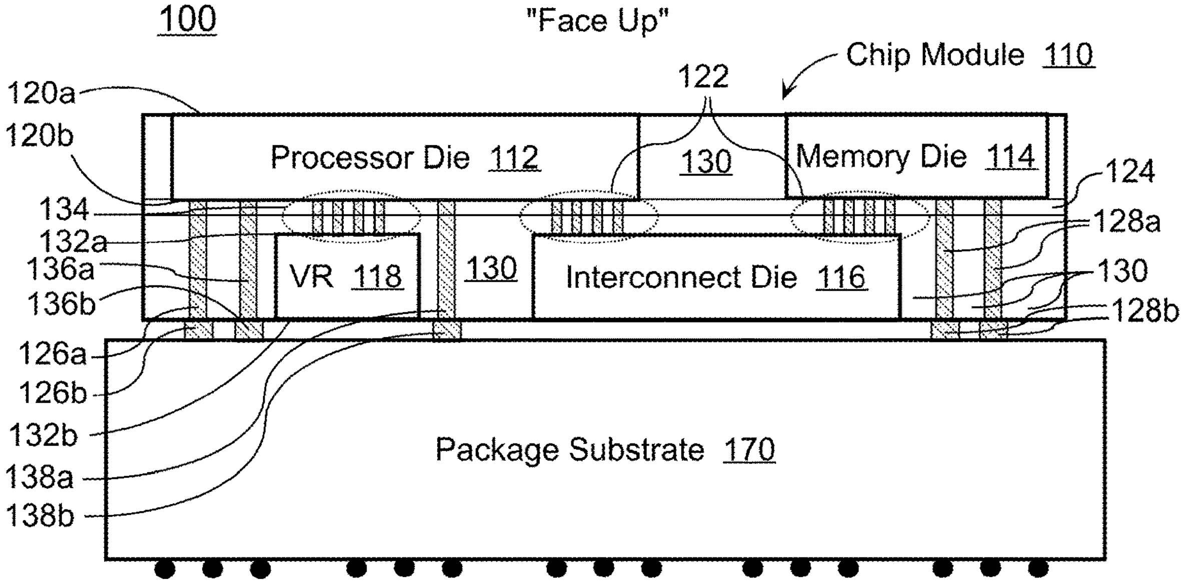
FIG. 1A is a block diagram that depicts a semiconductor device with a power component in a "Face Up" orientation.

FIG. 1A is a block diagram that depicts a semiconductor device 100 with an active device in the form of a power component in a "Face Up" orientation. In the example of FIG. 1A, the semiconductor device 100 includes a chip module 110 and a package substrate 170. The chip module 110 includes a processor die 112, a memory die 114, an interconnect die 116 and a power component in the form of a Voltage Regulator (VR) 118. Although implementations are depicted in the figures and described herein in the context of VRs, embodiments are not limited to this example and are applicable to any type of active components, including any type of power component. The relative sizes depicted in FIG. 1A are not necessarily representative of actual sizes and are presented for purposes of explanation. Also, although a single processor die 112, memory die 114, interconnect die 116 and VR 118 are depicted and described herein for purposes of explanation, implementations are applicable to Multi-Chip Modules (MCMs) with any number of processor dies, memory dies, interconnect dies and VRs.

The processor die 112 is a die for any type of processor, such as a Central Processing Unit (CPU), Graphics Processing Unit (GPU), Accelerated Processing Unit (APU), Application Specific Integrated Circuit (ASIC), Field Programmable Gate Array (FPGA), etc., and the memory die 114 is a die for any type of memory, such as High Bandwidth Memory (HBM), DRAM, SRAM, etc. The processor die 112 has a top surface 120*a* and a bottom surface 120*b*. The interconnect die 116 provides electrical connections between the processor die 112 and the memory die 114, for example, to carry commands and data between the computing elements formed on the processor die 112 and memory elements formed on the memory die 114. The interconnect die 116 is optional and alternatively an interposer is used to provide electrical connections between the processor die 112 and the memory die 114.

Connections 122 electrically connect the processor die 112 and the memory die 114 to the interconnect die 116 via a redistribution layer 124 and the connections 122 are implemented, for example, by metal pillars. The redistribution layer 124 is comprised of any number of metal routing layers. According to an implementation, the redistribution layer 124 is comprised of a polymer and acts as a stress buffer and/or an isolation film, while enabling redistribution layer routing. Connections 126*a*, 126*b*, 128*a*, 128*b* electrically connect, respectively, the processor die 112 and the memory die 114 to the package substrate 170. Connections 126*a*, 128*a* are comprised of metal pillars and connections 126*b*, 128*b* provide electrical connectivity to the package substrate 170 via, for example, C4 bumps or similar structures.

The VR 118 is any type of voltage regulator that is capable of converting an input voltage to one or more regulated output voltages. Example implementations of the VR 118 include, without limitation, an IC linear voltage regulator, an IC switching regulator, a DC/DC converter chip, etc. According to an implementation, the VR 118 is a silicon-based device. The VR 118 provides one or more regulated voltages to one or more components in the chip module 110 including, for example, circuitry on the processor die 112 and/or on the memory die 114. According to an implementation, the VR 118 provides one or more regulated voltages to multiple components, such as multiple processor dies, multiple memory dies, one or more processor dies and one or more memory dies, etc.

According to an implementation, the VR 118 is separately fabricated and then placed into the chip module 110 using a placement process, such as the process described in U.S. Pat. No. 10,510,721, the contents of which are hereby incorporated by reference in its entirety for all purposes. The processor die 112, the memory die 114, the interconnect die 116 and the VR 118 are held in position by a mold compound 130, such as an epoxy material, filler, etc.

Implementations are applicable to different physical sizes, shapes, and placements of the VR 118. In the example of FIG. 1A, the VR 118 is located between the processor die 112 and the package substrate 170 and more specifically, is completely underneath the processor die 112, i.e., the VR 118 does not extend beyond the bottom surface 120*b* of the processor die 112. Implementations include the VR 118 disposed only partially under the processor die 112 and beyond the processor die 112, i.e., to the left or right of the processor die 112. In implementations where the VR 118 provides a regulated voltage to multiple processor dies, the VR 118 is located partially underneath multiple processor dies, for example, in a similar manner to the way in which the interconnect die 116 is located underneath the processor die 112 and the memory die 114, with connections similar to the connections 122. According to an implementation, the VR 118 is part of the interconnect die 116.

The package substrate 170 is a semiconductor device package substrate that includes any number of layers, such as a substrate, upper layers, and lower layers, which vary depending on a particular implementation.

B. "Face Up" Orientation

The VR 118 has a top surface 132*a* and a bottom surface 132*b*. The physical orientation of the VR 118 varies depending upon a particular implementation. In the example of FIG. 1A, the VR 118 is oriented "face up" and includes circuitry for performing voltage regulation implemented, for example, with transistors and other components, electrical connections, such as metal traces, etc., on the top surface 132*a*. In the "face up" implementation, the VR 118 is electrically connected to both the processor die 112 and the redistribution layer 124 via connections 134, i.e., a portion of the connections 134 electrically connect the VR 118 to the processor die 112 and another portion of the connections 134 electrically connects the VR 118 to the redistribution layer 124, and ultimately the package substrate 170 as described hereinafter. According to an implementation, a first portion of the connections 134 is dedicated to electrically connecting the VR 118 to the processor die 112 and a second portion of the connections 134 is dedicated to electrically connecting the VR 118 to the redistribution layer 124. The connections 134 are implemented by metal pillars or other similar structures, like the connections 122.

Connections 136*a*, 136*b* and 138*a*, 138*b* electrically connect the redistribution layer 124 to the package substrate 170. The connections 136*a*, 136*b* and 138*a*, 138*b* are implemented by metal pillars, similar to connections 122. Implementations are not limited to the exact numbers of connections 134, 136*a*, 136*b*, 138*a*, 138*b* depicted in FIG. 1A and include any number and sizes of connections, depending upon the requirements of a particular implementation.

According to the "face up" implementation, an input voltage is provided from the package substrate 170 to the VR 118 via the connections 136*a*, 136*b* and 138*a*, 138*b*, the redistribution layer 124 and the portion of the connections 134 that connect the redistribution layer 124 to the VR 118. The VR 118 provides a regulated output voltage to the processor die 112 via the portion of the connections 134 that connect the VR 118 to the processor die 112, and not the portion of the connections that are used to supply the input voltage to the VR 118. According to an implementation, the input voltage provided by the package substrate 170 is higher than the regulated output voltage that is provided to the processor die 112.

C. "Face Down" Orientation

Figure 1B:
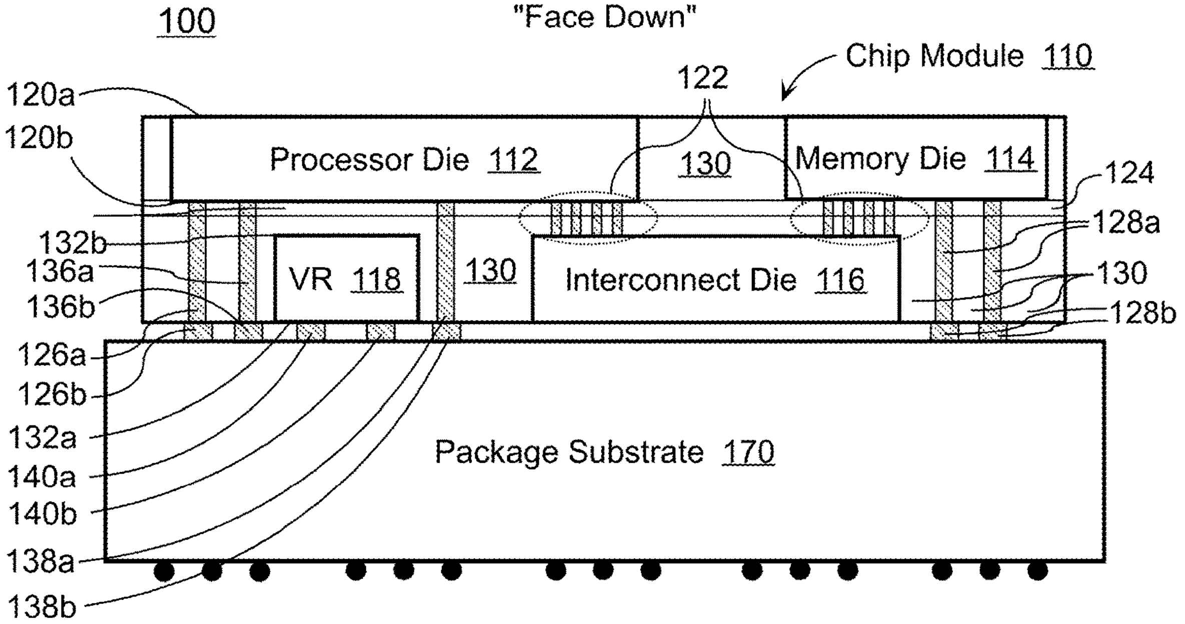
FIG. 1B is a block diagram that depicts a semiconductor device with a power component in a "Face Down" orientation.

According to a "face down" implementation, the VR 118 is oriented so that the top surface 132*a* with the circuitry for performing voltage regulation, electrical connections, etc., faces downward towards the package substrate 170. FIG. 1B is a block diagram that depicts the semiconductor device 100 with a power component in a "Face Down" orientation. In this implementation, both the input voltage and the regulated output voltage are provided to and from the VR 118 via the package substrate 170 and connections between the VR 118 and the package substrate 170. As depicted in FIG. 1B, connections 140*a*, 140*b* provide electrical connections between the VR 118 and the package substrate 170. According to an implementation, the connections 140*a*, 140*b* are implemented by C4 bumps or similar features. Although depicted in FIG. 1B as a single connection, the connections 140*a*, 140*b* may include any number of connections, such as multiple C4 bumps or similar features.

In the "face down" implementation depicted in FIG. 1B, an input voltage is provided by the package substrate 170 to the VR 118 via the connection 140*b*. The VR 118 generates and provides a regulated output voltage via the connection 140*a*, which is delivered to the processor die 112 via a redistribution layer, metal traces, or any other type of metal conductors on the package substrate 170 and the connections 136*a*, 136*b*.

D. Through-Silicon Vias

Figure 1D:
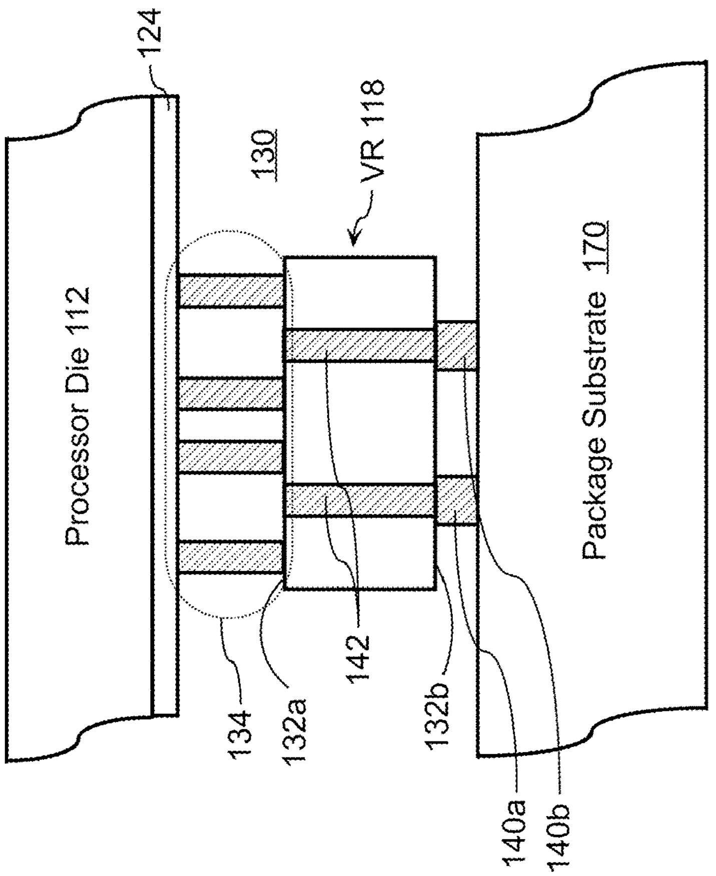
FIG. 1D depicts a semiconductor device structure that uses TSVs with a power component in a "Face Up" orientation.
Figure 1C:
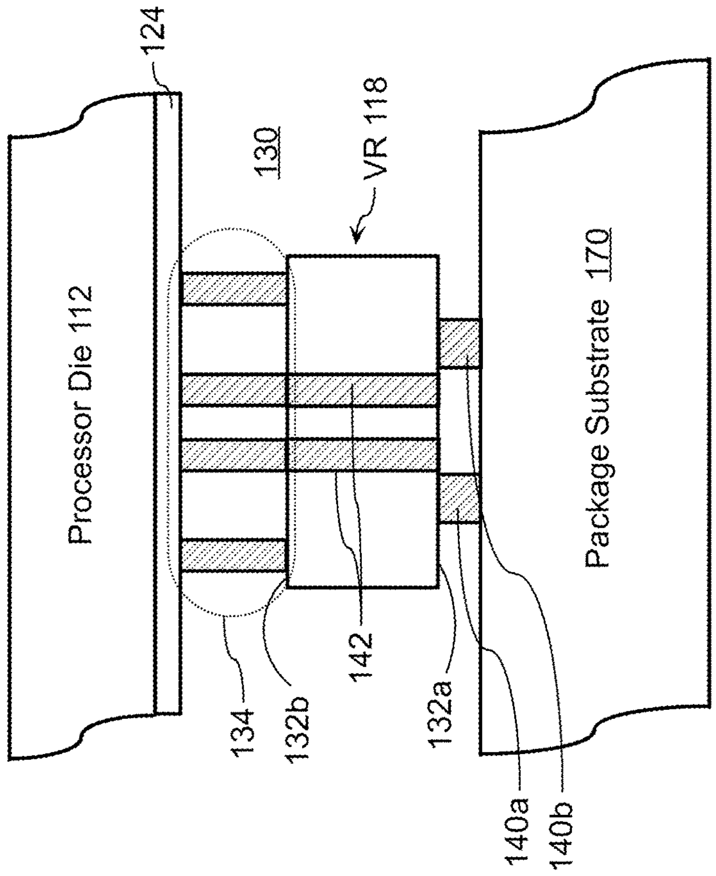
FIG. 1C depicts a semiconductor device structure that uses TSVs with a power component in a "Face Down" orientation.

According to an implementation, Through-Silicon Vias (TSVs) are used to provide a compact semiconductor device structure with reduced use of metal connections. FIG. 1C depicts a semiconductor device structure that uses TSVs with a power component in a "Face Down" orientation. In FIG. 1C, only portions of certain elements are depicted to better depict other elements.

In this example, the VR 118 is oriented "Face Down" so that the top surface 132*a* with the electrical connections and circuitry, such as metal traces, etc., faces downward towards the package substrate 170. In this implementation, an input voltage is provided by the package substrate 170 to the VR 118 via one or both of the connections 140*a*, 140*b*. The VR 118 generates a regulated voltage and provides the regulated voltage through one or more TSVs 142 to the connections 134 on the bottom surface 132*b*, and then to the processor die 112 via the redistribution layer 124, metal traces, etc. This provides the technical benefits of short path lengths while using relatively few connection resources, such as connections 136*a*, 136*b*, 138*a*, 138*b* (FIG. 1A). The ends of the TSVs 142 at the bottom surface 132*b* are not required to be aligned with the connections 134 and according to an implementation, the TSVs 142 are partially or entirely offset from the connections 140*a*, 140*b* and electrical connections from the TSVs 142 to the connections 140*a*, 140*b* are provided by one or more metal traces or similar structures on the bottom surface 132*b*.

According to an implementation, TSVs are used with semiconductor device structures with a power component in a "Face Up" orientation. FIG. 1D depicts a semiconductor device structure that uses TSVs with a power component in a "Face Up" orientation. In this example, the VR 118 is oriented "Face Up" so that the top surface 132*a* with the electrical connections and circuitry, such as metal traces, etc., faces upward towards the processor die 112. In this implementation, an input voltage is provided by the package substrate 170 to the VR 118 via one or both of the connections 140*a*, 140*b*. Implementations are not limited to one or two connections and may include a greater number of connections.

The input voltage is provided to the circuitry on the top surface 132*a* by the TSVs 142. The VR 118 generates a regulated voltage and provides the regulated voltage through the connections 134 and the redistribution layer 124, metal traces, etc., to the processor die 112. This provides the technical benefits of short path lengths while using relatively few connection resources, such as connections 136*a*, 136*b*, 138*a*, 138*b*, but in this implementation the TSVs 142 carry the input voltage instead of the regulated voltage as in FIG. 1C. The connections 140*a*, 140*b* are not required to be aligned with the TSVs 142 and according to an implementation, the connections 140*a*, 140*b* are partially or entirely offset from the TSVs 142 and electrical connections from the connections 140*a*, 140*b* to the TSVs 142 are provided by one or more metal traces or similar structures.

Figure 2:
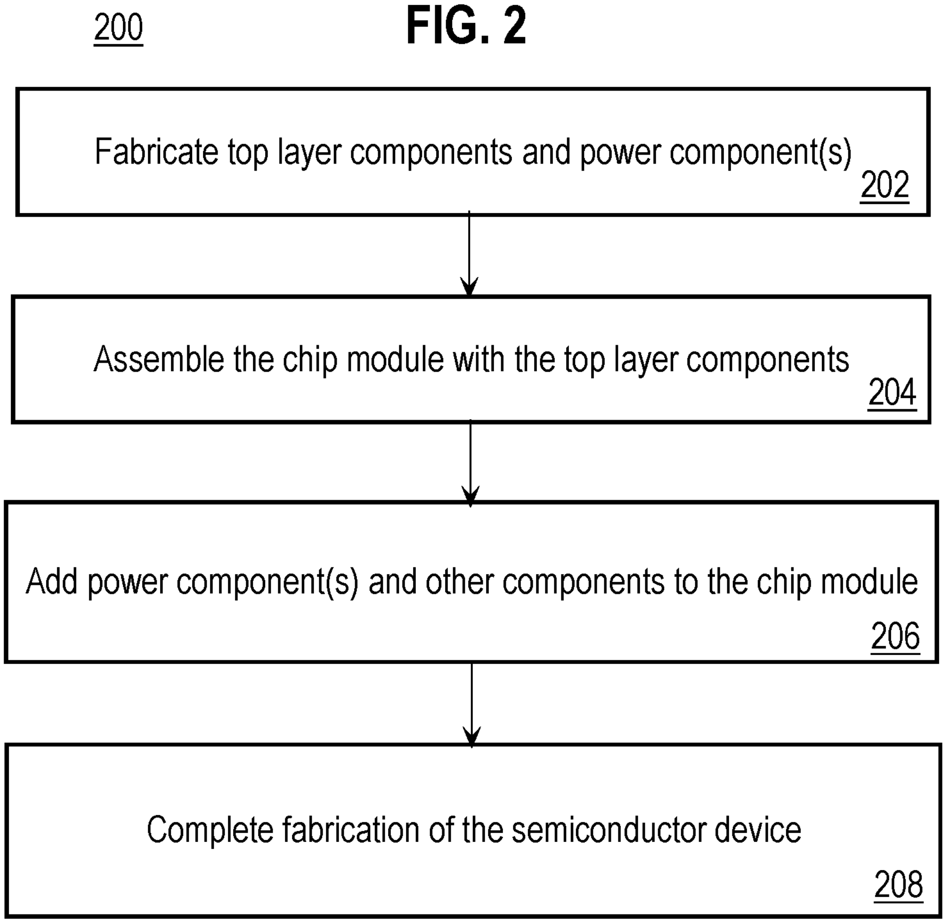
FIG. 2 is a flow diagram that depicts an approach for fabricating a semiconductor device with one or more power components disposed between a processor die and a package substrate.

FIG. 2 is a flow diagram 200 that depicts an approach for fabricating a semiconductor device with one or more power components disposed between a processor die and a package substrate. In step 202, one or more top layer components and power components to be included in the semiconductor device are fabricated. For example, the processor die 112, the memory die 114, and a voltage regulator such as VR 118 are fabricated. In step 204, the one or more top layer components are assembled into the chip module. For example, the processor die 112 and the memory die 114 are assembled into the chip module 110.

In step 206, the power components and other components are added to the chip module. For example, the interconnect die 116 and the VR 118 are added to the chip module 110 on the package substrate 170 using HDCL technology and secured in place with the mold compound 130. According to an implementation, this includes adding the connections 126*b*, 128*b*, 136*b* and 138*b* to the bottom of the chip module 110.

In step 208, the fabrication of the semiconductor device is completed, for example, by assembling the top layer components, e.g., the processor die 112 and the memory die 114, with the components from step 206, e.g., the VR 118 and the interconnect die 116, by adding or otherwise connecting the vertical connections at the interface, e.g., connections 122, 134 and connections 126*a*, 136*a*, 138*a*, 128*a*. Not all of the steps of FIG. 2 are required in some implementations, and additional steps are used in some implementations.

The invention claimed is:

1. A semiconductor device comprising:

a first layer comprising a processor die;

a second layer comprising an active device;

a third layer comprising a package substrate; and a redistribution layer, disposed between the first layer and the second layer, comprising one or more metal routing layers, wherein:

the second layer is disposed between the first layer and the third layer, one or more first electrical connections connect a first surface of the active device to the package substrate, one or more second electrical connections connect the first surface of the active device to the processor die via the one or more metal routing layers of the redistribution layer, the one or more second electrical connections are different than the one or more first electrical connections, the first surface of the active device faces a bottom surface of the processor die, and the one or more first electrical connections include one or more first metal pillars connecting the first surface of the active device to the redistribution layer and one or more second metal pillars connecting the package substrate to the redistribution layer.

2. The semiconductor device of claim 1, wherein the active device includes a power component.

3. The semiconductor device of claim 2, wherein the power component includes a voltage regulator.

4. The semiconductor device of claim 1, wherein:

an input voltage is provided from the package substrate to the first surface of the active device via the one or more first electrical connections, and an output voltage is provided from the first surface of the active device to the processor die via the one or more second electrical connections.

5. The semiconductor device of claim 4, wherein:

the one or more second electrical connections include one or more metal pillars connecting the first surface of the active device to the redistribution layer.

6. The semiconductor device of claim 4, wherein the active device includes a voltage regulator, and the output voltage is a regulated voltage that is generated by the voltage regulator based upon the input voltage.

7. The semiconductor device of claim 4, the semiconductor device further comprises one or more through-silicon vias from a bottom surface of the active device to a top surface of the active device, and the one or more first electrical connections use the through-silicon vias to provide the input voltage from the package substrate to the first surface of the active device.

8. The semiconductor device of claim 7, wherein the one or more second electrical connections further comprise metal pillars between the top surface of the active device and the bottom surface of the processor die.

9. The semiconductor device of claim 8, wherein the redistribution layer is disposed between the top surface of the active device and the bottom surface of the processor die.

10. A semiconductor device comprising:

a first layer comprising a processor die;

a second layer comprising an active device;

a third layer comprising a package substrate; and a redistribution layer, disposed between the first layer and the second layer, comprising one or more metal routing layers, wherein:

the second layer is disposed between the first layer and the third layer, one or more first electrical connections connect a first surface of the active device to the package substrate, one or more second electrical connections connect the first surface of the active device to the processor die via the one or more metal routing layers of the redistribution layer, the one or more second electrical connections are different than the one or more first electrical connections, the first surface of the active device faces a top surface of the package substrate, and the one or more second electrical connections include one or more metal conductors on the package substrate, connections between the first surface of the active device and the one or more metal conductors on the package substrate, and one or more connections between the one or more metal conductors on the package substrate and the redistribution layer.

11. The semiconductor device of claim 10, wherein:

an input voltage is provided from the package substrate to the first surface of the active device via the one or more first electrical connections, and an output voltage is provided from the first surface of the active device to the processor die via the one or more second electrical connections.

12. The semiconductor device of claim 11, wherein the active device includes a voltage regulator, and the output voltage is a regulated voltage that is generated by the voltage regulator based upon the input voltage.

13. The semiconductor device of claim 11, the semiconductor device further comprises one or more through-silicon vias from a top surface of the active device to a bottom surface of the active device, and the one or more second electrical connections use the through-silicon vias to provide the output voltage from the first surface of the active device to the redistribution layer.

14. The semiconductor device of claim 13, wherein the one or more second electrical connections further comprise metal pillars between the bottom surface of the active device and the bottom surface of the processor die.

15. The semiconductor device of claim 14, wherein the redistribution layer is disposed between the active device and the bottom surface of the processor die.

* * * * *